United States Patent
Li et al.

(10) Patent No.: US 9,425,060 B2
(45) Date of Patent: Aug. 23, 2016

(54) METHOD FOR FABRICATING MULTIPLE LAYERS OF ULTRA NARROW SILICON WIRES

(71) Applicant: Peking University, Beijing (CN)

(72) Inventors: Ming Li, Beijing (CA); Yuancheng Yang, Beijing (CN); Jiewen Fan, Beijing (CN); Haoran Xuan, Beijing (CN); Hao Zhang, Beijing (CN); Ru Huang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 14/907,371

(22) PCT Filed: Mar. 28, 2014

(86) PCT No.: PCT/CN2014/074278
§ 371 (c)(1),
(2) Date: Jan. 25, 2016

(87) PCT Pub. No.: WO2015/131424
PCT Pub. Date: Sep. 11, 2015

(65) Prior Publication Data
US 2016/0181114 A1 Jun. 23, 2016

(30) Foreign Application Priority Data
Mar. 6, 2014 (CN) .......................... 2014 1 0080939

(51) Int. Cl.
*H01L 21/302* (2006.01)
*H01L 21/461* (2006.01)
(Continued)

(52) U.S. Cl.
CPC ..... *H01L 21/3088* (2013.01); *H01L 21/02532* (2013.01); *H01L 21/02603* (2013.01);
(Continued)

(58) Field of Classification Search
CPC ................... H01L 21/3088; H01L 21/02532; H01L 21/02603
USPC .................................................. 438/150, 704
See application file for complete search history.

(56) References Cited

U.S. PATENT DOCUMENTS 5,116,773 A 5/1992 Park et al.
2006/0148107 A1 7/2006 Yaegashi
(Continued)

FOREIGN PATENT DOCUMENTS

CN 101789363 A 7/2010
CN 102427023 A 4/2012
(Continued)

*Primary Examiner* — David S Blum
(74) *Attorney, Agent, or Firm* — Bozicevic, Field & Francis LLP; Bret E. Field

(57) ABSTRACT

A method for fabricating multiple layers of ultra narrow silicon wires comprises the steps of fabricating wet-etch masking layers of silicon; forming a Fin and source/drain regions located at both ends thereof by epitaxy; forming the multiple layers of ultra narrow silicon wires. The present invention has advantages in that: the atom layer depositing may define the position of the ultra narrow silicon wires accurately, having a good controllability; the anisotropic wet-etch for silicon is performed in a self-stop manner and has a large process window, so that the cross-section shape of the nanowires formed by wet-etch is uniform and smooth. The method to form multiple layers of wet-etch masks at the sidewalls of Fins, in which wet-etch masking layers are formed prior to the epitaxy of Fins is a simple process, so that the multiple sidewall wet-etch masking layers may be obtained by only one etching to the epitaxy window, regardless of the numbers of the wet-etch masking layers; a wire with a diameter less than 10 nm may be fabricated by virtue of the oxidation technology, and thus satisfies the small size devices; the TMAH solution, which is simple and safe to control, is used in the wet-etch for polysilicon, and metal ions are not introduced and thus suitable for the integrated circuit manufacturing process; the method according to the present invention is fully compatible with the planar transistor based on the bulk silicon, and thus the process cost is small.

10 Claims, 5 Drawing Sheets

(51) Int. Cl.
  *H01L 21/00*     (2006.01)
  *H01L 21/84*     (2006.01)
  *H01L 21/308*    (2006.01)
  *H01L 21/02*     (2006.01)
  *H01L 21/306*    (2006.01)
  *H01L 29/04*     (2006.01)
  *H01L 29/06*     (2006.01)
  *H01L 29/423*    (2006.01)
  *H01L 29/66*     (2006.01)
  *H01L 29/786*    (2006.01)

(52) U.S. Cl.
  CPC ..... *H01L21/02609* (2013.01); *H01L 21/3081* (2013.01); *H01L 21/3085* (2013.01); *H01L 21/3086* (2013.01); *H01L 21/30608* (2013.01); *H01L 21/30625* (2013.01); *H01L 29/045* (2013.01); *H01L 29/0673* (2013.01); *H01L 29/42392* (2013.01); *H01L 29/66742* (2013.01); *H01L 29/78654* (2013.01); *H01L 29/78696* (2013.01)

(56) References Cited

U.S. PATENT DOCUMENTS

| | | | |
|---|---|---|---|
| 2016/0049489 A1* | 2/2016 | Wan | H01L 29/42392 257/347 |
| 2016/0071931 A1* | 3/2016 | Cheng | H01L 21/0245 257/329 |
| 2016/0111543 A1* | 4/2016 | Fang | H01L 29/7851 438/592 |

FOREIGN PATENT DOCUMENTS

| | | |
|---|---|---|
| CN | 102496563 A | 6/2012 |
| CN | 102945791 A | 2/2013 |

* cited by examiner

US 9,425,060 B2

METHOD FOR FABRICATING MULTIPLE LAYERS OF ULTRA NARROW SILICON WIRES

CROSS-REFERENCES TO RELATED APPLICATION

The present application claims the priority of Chinese Patent Application (No. 201410080939.3), filed on Mar. 6, 2014, which is incorporated herein by reference in its entirety.

FIELD OF THE INVENTION

The present invention relates to a manufacturing technology of ultra large scale integrated circuits, relates to a method for fabricating ultra narrow silicon wires in the integrated circuits, and particularly relates to a method of fabricating multiple layers of ultra narrow silicon wires with controllable position and shape by using a combination of selective epitaxy and anisotropic wet etch technologies for silicon.

BACKGROUND OF THE INVENTION

As Moore's Law advanced into the 22 nm technology node, the conventional planar device has exhibited serious problems in terms of short channel effect and reliability issues, leading to serious degradation of device performance and thus the requirements of Moore's Law cannot be satisfied. A fin-type field effect transistor (FinFET), as a representative of the three-dimensional multi-gate devices (Multi-gate MOSFET, MuGFET), has been mass-produced successfully at the 22 nm technology node by virtue of advantages such as the excellent ability to suppress short channel effect, high integration density, and compatibility with the conventional CMOS process.

Among the three-dimensional multi-gate devices, a multi-bridge-channel gate-all-around nanowire field effect transistor (MBC GAA NWFET) has prominent gate-control ability, and ultra-high integration density and driving current, becoming a strong competitor beyond 22 nm technology node.

One of the key technologies for manufacturing the multi-bridge-channel gate-all-around nanowire field effect transistor is to fabricate multiple layers of ultra narrow silicon wires having a uniform and controllable position and cross-sectional shape.

The Ricky M. Y. Ng team at Hong Kong University of Science and Technology combined Bosch process in the inductively coupled plasma (ICP) etching and the sacrificial oxidation method to form multiple layers of nanowires in an up-and-down arrangement [M. Y. Ng Ricky, et al., EDL, 2009, 30(5): 520-522]. However, the position and cross-sectional shape of the nanowire formed by this method are uncontrollable due to the process fluctuations, thus causing serious fluctuations in device performance.

Sung-Young Lee et al. in South Korea's Samsung Electronics Co. successfully fabricated a multi-bridge-channel field effect transistor on a bulk silicon substrate by using SiGe as a sacrificial layer [Sung-Young Lee, et al., TED, 2003, 2(4): 253-257]. The core technology is to form a Si—SiGe superlattice structure on the bulk silicon by epitaxy, and then form multiple layers of suspended channels by removing the SiGe sacrificial layer using wet etch. However, the thickness of each film in this superlattice structure is constrained by factors such as lattice mismatch and stress release. Also, the process is relatively complicated, causing a long production cycle.

SUMMARY OF THE INVENTION

Directing to the above problems, the present invention is to provide a method for fabricating multiple layers of ultra narrow silicon wires by using a combination of selective epitaxy and anisotropic wet etch. The multiple layers of ultra narrow silicon wires fabricated according to the present method have the advantages of having a uniform and controllable position and cross-sectional shape.

The terms used herein are described as follows: according to definitions in the first chapter of "*Semiconductor Physics*" written by Ye Liangxiu, (100), (110), (111) are the Miller indices of crystal planes, and <100>, <110>, <111>, <112> are the indices of crystal orientations.

The technical solutions of the present invention are described as follows.

A method for fabricating multiple layers of ultra narrow silicon wires comprising the following steps:

A. fabricating wet-etch masking layers for silicon, wherein multiple layers of wet-etch masking layers are formed at sidewalls of a fin-shaped silicon island (Fin) that is to be formed by step B3, wherein the number and positions of the wet-etch masking layers determine the number and positions of the ultra narrow silicon wires, and the thickness of the sacrificial layer defines the interval between the ultra narrow silicon wires, and wherein in order to ensure that the multiple layers of ultra narrow silicon wires formed by the step C1 are completely separated up and down, the thickness H of the sacrificial layer and the width ($W_{Fin}$) of the Fin should satisfy the following conditions: $H > W_{Fin} * \tan 54.7°$ for a (100) substrate, $H > W_{Fin} * \cot 54.7°$ for a (110) substrate, and $H > 0$ for a (111) substrate, where 54.7° is an intersection angle between crystal planes of (100) and (111) of silicon, wherein the step comprises:

A1. depositing a sacrificial layer on a silicon substrate;

A2. depositing a wet-etch masking layer on the sacrificial layer;

A3. repeating the steps A1 and A2 alternately to form a periodic stack structure of the sacrifice layer—the masking layer;

B. forming the Fin and source/drain regions located at both ends thereof by an epitaxy process, wherein the epitaxy process is performed on the silicon substrate to form the Fin and source/drain regions connected to both ends thereof, wherein in order to ensure that an anisotropic wet etch to the sidewalls of the Fin to be performed in step C1 self-stops at (111) crystal plane to form the multiple layers of suspended ultra narrow silicon wires each having a polygonal cross section, the crystal orientation of the substrate, the axial direction of the Fin and the crystal orientation of the Fin sidewalls should satisfy the following conditions: the axial direction of the Fin and the crystal orientation of the Fin sidewalls both extend along <110> for a (100) substrate; the axial direction of the Fin extends along <110> and the crystal orientation of the Fin sidewalls extends along <100> for a (110) substrate; the axial direction of the Fin extends along <112> and the crystal orientation of the Fin sidewalls extends along <110> for a (111) substrate, and wherein the source-drain region is selected to have a micron scale so that both ends of the ultra narrow silicon wires to be formed by step C1 have enough silicon as a support, and wherein the aspect ratio of a Fin is selected to satisfy the numbers of layers of the resultantly formed ultra narrow silicon wires, wherein the step comprises:

B1. defining an epitaxy window for Fins and source/drain regions by photolithography on the periodic stack structure of the sacrificial layer—the masking layer formed in the step A3;

B2. performing an anisotropic etching process to transfer patterns defined by the photolithography onto the stack structure of the sacrificial layer—the masking layer and to expose the silicon substrate;

B3. forming the Fin and source/drain regions connected to both ends of the Fin within the etched epitaxy window formed in the step B2 by an epitaxy process, wherein the epitaxial silicon has a greater thickness than the total thickness of the stack structure of the sacrificial layer—the masking layer;

B4. removing the silicon on top of the wet-etch masking layer by chemical mechanical polishing to expose the wet-etch masking layer;

B5. depositing a wet-etch masking layer on top of the Fin and source/drain regions connected to both ends of the Fin, which are formed by the epitaxy process;

B6. defining a wet-etch window for the silicon by photolithography on the periodic stack structure of the sacrificial layer—the masking layer;

B7. performing an anisotropic etching process to transfer patterns defined by photolithography onto the stack structure of the sacrificial layer—the masking layer and to expose the silicon substrate;

B8. removing the sacrificial layer by isotropic wet etch;

C. forming the multiple layers of ultra narrow silicon wires, wherein anisotropic wet etch is performed from the sidewalls of the Fin, so that the wet etch self-stops at (111) crystal plane under protection of the wet-etch masking layer at the sidewalls, and multiple layers of ultra narrow silicon wires each having a polygonal cross section are formed, and then the area of the cross section is further reduced by sacrificial oxidation to form a circular cross section, and wherein the step comprises:

C1. forming multiple layers of ultra narrow silicon wires each having a polygonal cross section by anisotropic wet etch;

C2. removing the masking layer by isotropic wet etch;

C3. forming multiple layers of ultra narrow silicon wires each having a circular cross section by sacrificial oxidation;

C4. removing the sacrificial oxidation layer wrapping each ultra narrow silicon wire by isotropic wet etch.

Further, in the steps A1 and B2, the substrate is a bulk silicon substrate or a SOI substrate.

Further, in the steps B1 and B6, the photolithography is electron beam photolithography or 193 nm immersion photolithography or other advanced optical photolithography.

Further, in the steps A1, A2, A3 and B5, the deposition is ALD (atomic layer deposition), LPCVD (low pressure chemical vapor deposition), PECVD (plasma enhanced chemical vapor deposition), ICPECVD (inductively coupled plasma enhanced chemical vapor deposition) or sputtering and so on, wherein ALD is preferable.

Further, the sacrificial layer can be formed of $SiO_2$, and the $SiO_2$ sacrificial layer can be removed by BHF (buffered hydrofluoric acid) solution with a solution concentration of $HF:NH_4F=1:30-1:100$, preferably 1:40 at room temperature; the wet-etch masking layer can be formed of $Si_3N_4$, and the $Si_3N_4$ masking layer can be removed by concentrated phosphoric acid at 170° C.

Further, the combination of the sacrificial layer and the wet-etch masking layer is not limited to $SiO_2$ and $Si_3N_4$ but has to satisfy the following conditions: the ratio of etch rates of the sacrificial layer and the wet-etch masking layer is 1:0.5-1:2; the ratio of etch rates of the sacrificial layer and the photoresist is greater than 5:1; the ratio of etch rates of the wet-etch masking layer and the photoresist is greater than 5:1; the ratio of etch rates of the sacrificial layer and the silicon is greater than 5:1; the ratio of etch rates of the wet-etch masking layer and the silicon is greater than 5:1.

Further, the anisotropic wet etch of the silicon is performed by using TMAH (tetramethyl ammonium hydroxide) solution with a concentration of 10 wt %-25 wt %, preferably 25 wt %, at 35° C.-60° C., preferably 40° C.

Further, in the step C3, the sacrificial oxidation of the ultra narrow silicon wires is dry oxidation at 850° C.-950° C., preferably 925° C.

The advantageous and positive effects of the present invention are described as follows.

1) The position and the cross-section shape of the resultantly formed multiple layers of ultra narrow silicon wires are uniform and controllable.

2) The atom layer depositing may define the position of the ultra narrow silicon wires accurately, having a good controllability.

3) The anisotropic wet etch for silicon is performed in a self-stop manner and has a large process window, so that the cross-section shape of the nanowires formed by this manner is uniform and smooth.

4) The method to form multiple layers of wet-etch masks at the sidewalls of Fins, in which wet-etch masking layers are formed prior to the epitaxy of Fins, is a simple process, so that the multiple layers of wet-etch masks at the sidewalls of Fins can be obtained by only one etch for the epitaxy window, regardless of the number of the wet-etch masking layers.

5) A wire with a diameter less than 10 nm can be obtained by virtue of the oxidation technology, thus satisfying small size devices.

6) The TMAH solution, which is simple and safe to control, is used in the wet etch for polysilicon, and metal ions are not introduced and thus suitable for the integrated circuit manufacturing process.

7) The method according to the present invention is fully compatible with the planar transistor based on the bulk silicon, and thus the process cost is small.

BRIEF DESCRIPTION OF THE DRAWINGS

FIG. 1 shows a step of forming a stack structure by alternately depositing a sacrificial layer and a wet-etch masking layer;

FIG. 2 shows a step of etching an epitaxy window for Fins and source/drain regions;

FIG. 3 shows a step of forming the Fin and source/drain regions by epitaxy and removing the excessive silicon by chemical mechanical polishing;

FIG. 4 shows a step of performing chemical mechanical polishing on the wet-etch masking layer on top;

FIG. 5 shows a step of forming an anisotropic wet-etch window for silicon;

FIG. 6 shows a step of removing the sacrificial layer;

FIG. 7 shows a step of forming multiple layers of ultra narrow silicon wires each having a polygonal cross section by anisotropic wet etch;

FIG. 8 shows a step of removing a sacrificial oxidation layer wrapping each silicon wire by isotropic wet etch and thus obtaining the multiple layers of ultra narrow silicon wires each having a circular cross section;

DETAILED DESCRIPTION OF THE EMBODIMENTS

Hereinafter, the present invention will be illustrated in detail with reference to the accompany figures and specific examples.

Embodiment 1

Figure 1:
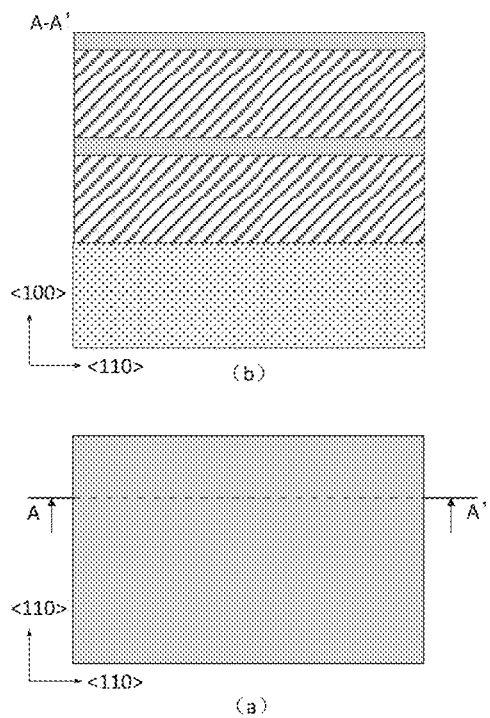
FIG. 1 to FIG. 8 show schematic views of a process flow for fabricating multiple layers of ultra narrow silicon wires based on wet etch according to the present invention. In each figure, (a) shows a top view; (b) and (c) show cross sectional views taken along A-A' and B-B' of (a), respectively, where in the figures.
Figure 2:
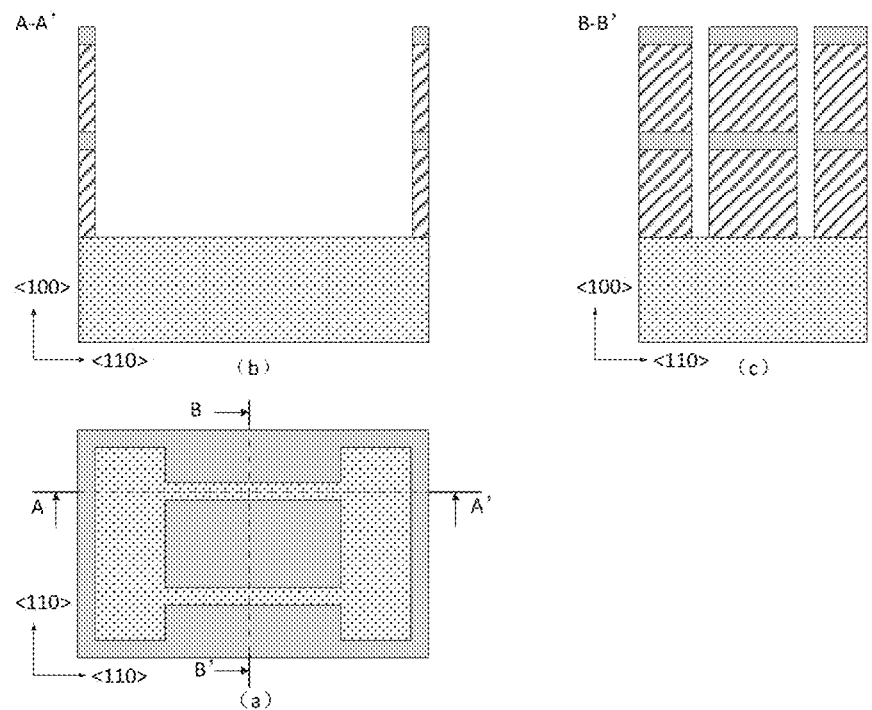
Figure 3:
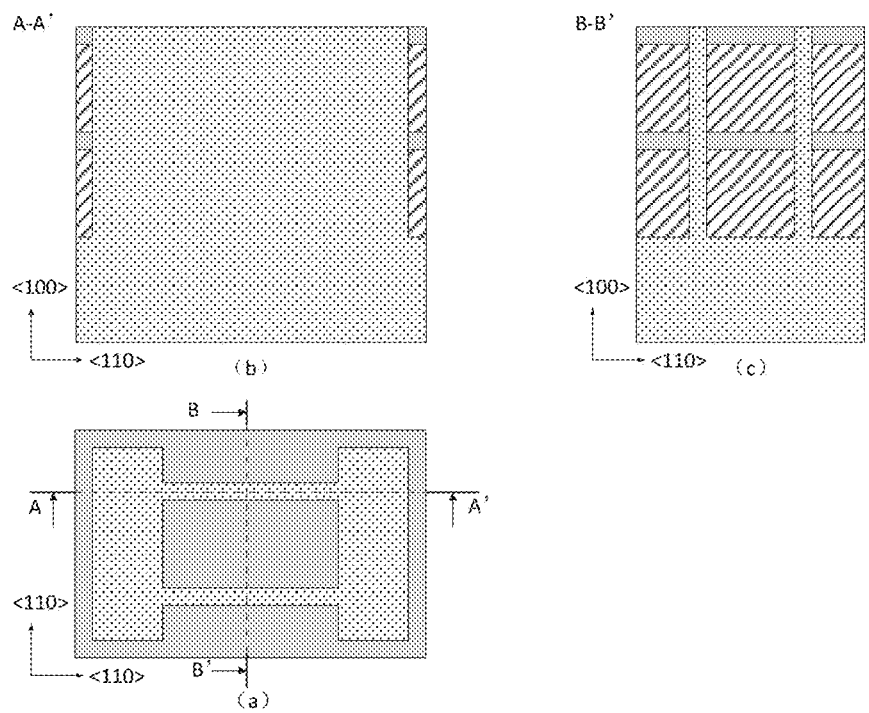
Figure 4:
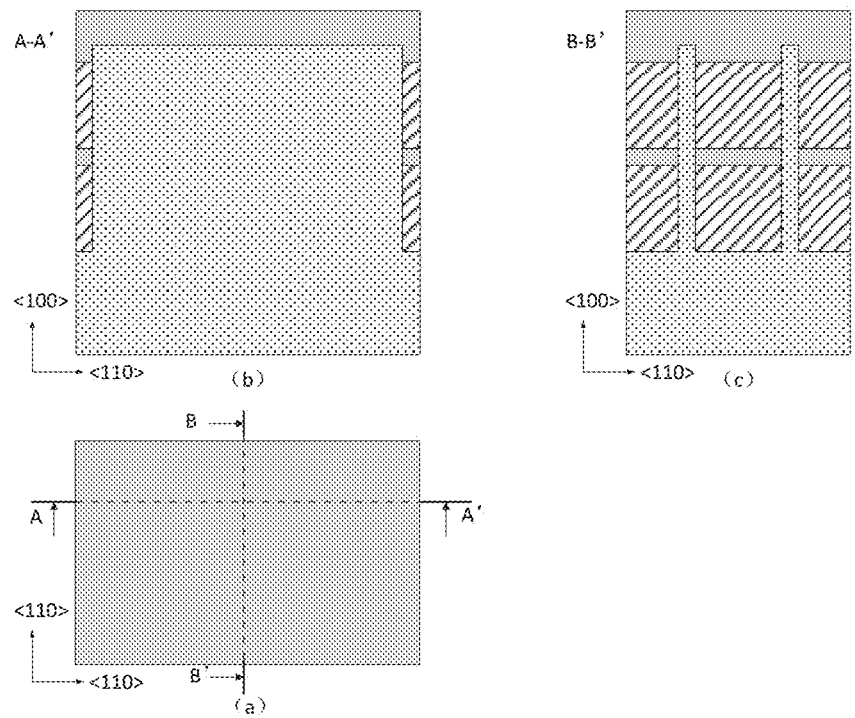
Figure 5:
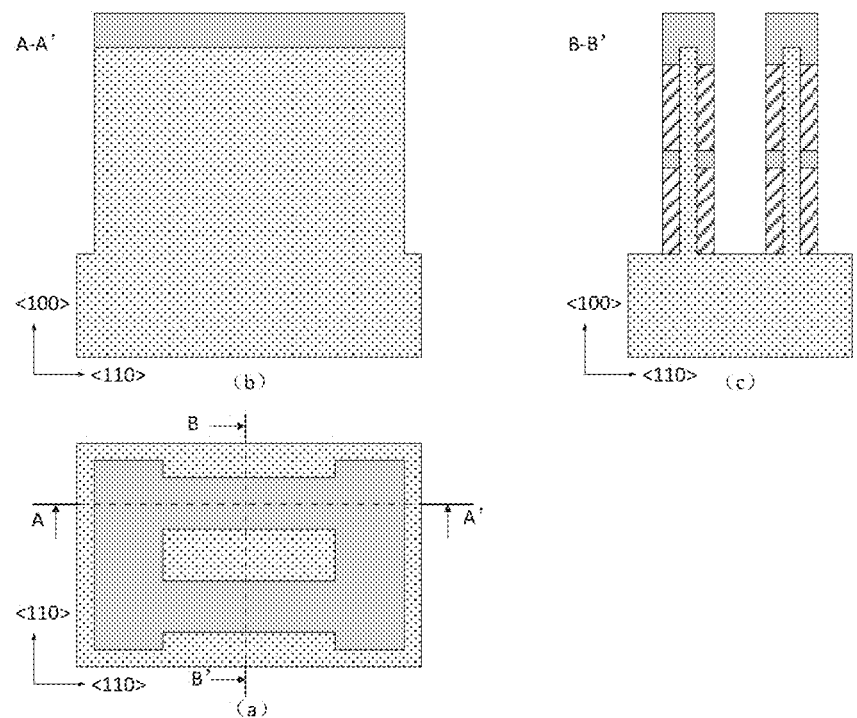
Figure 6:
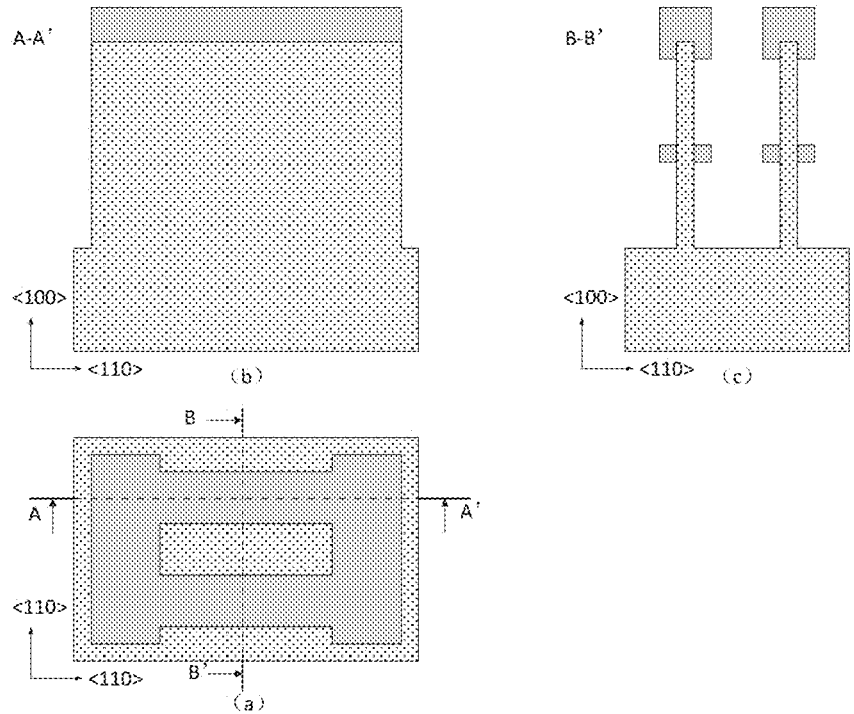
Figure 7:
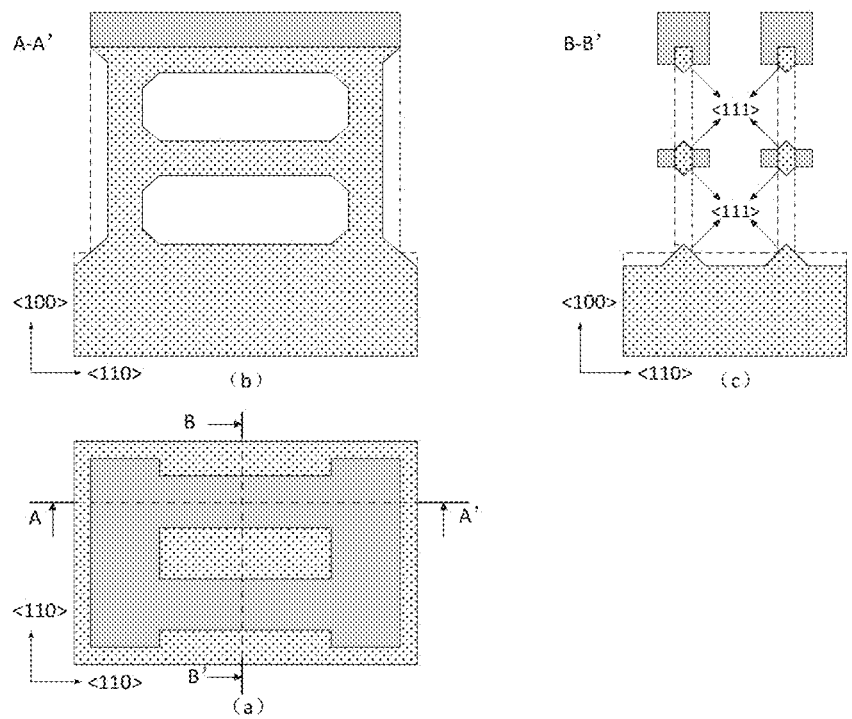
Figure 8:
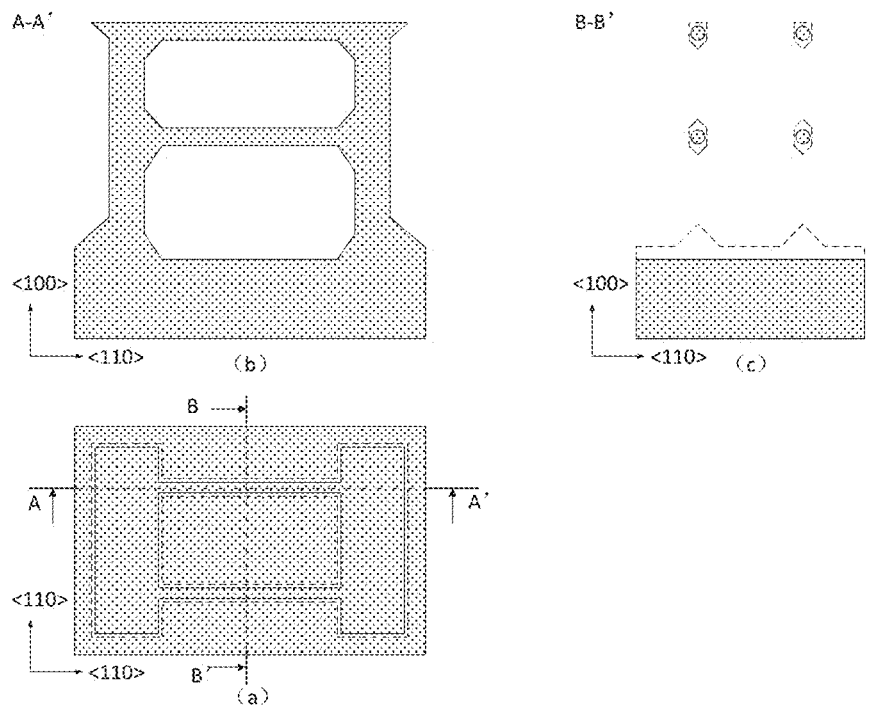
Figure 9:
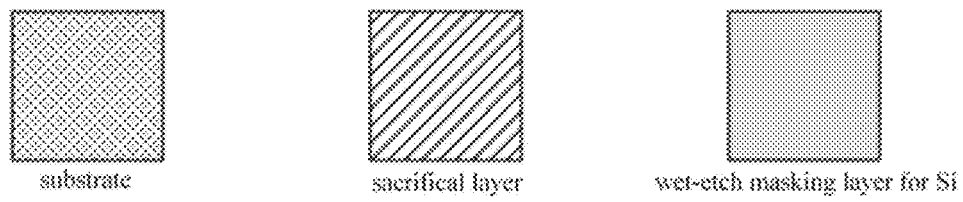
FIG. 9 shows the graphic representation.

Two layers of nanowires each having a diameter of about 5 nm can be obtained according to the following steps:

1) Depositing $SiO_2$ of 300 Å as a sacrificial layer on a (100) bulk silicon substrate by ALD;
2) Depositing $Si_3N_4$ of 200 Å as a wet-etch masking layer by ALD;
3) Depositing $SiO_2$ of 300 Å as the sacrificial layer by ALD;
4) Depositing $Si_3N_4$ of 200 Å as the wet-etch masking layer by ALD, as shown in FIG. 1;
5) Defining an epitaxy window for Fins and source/drain regions by electron beam photolithography, wherein the Fin has a width of 20 nm and a length of 00 nm, meanwhile, the axial direction of the Fin and the crystal orientation of the Fin sidewalls both extend along <110>;
6) Etching the stack structure of the sacrificial layer-masking layer anisotropically to transfer patterns defined by photolithography onto the stack structure and to expose the silicon substrate;
7) Removing photoresists, as shown in FIG. 2;
8) Growing silicon of 1200 Å by selective epitaxy;
9) Removing the excessive silicon on top by chemical mechanical polishing to expose the $Si_3N_4$ wet-etch masking layer on top, as shown in FIG. 3;
10) Depositing $Si_3N_4$ of 300 Å as a top wet-etch masking layer by ALD, as shown in FIG. 4;
11) Defining a wet-etch window for the silicon by electron beam photolithography;
12) Removing the $SiO_2$—$Si_3N_4$ stack layers within the window by performing anisotropic dry etching to expose the silicon on bottom;
13) Removing photoresists, as shown in FIG. 5;
14) Removing the $SiO_2$ sacrificial layer by BHF solution (HF:$NH_4F$=1:40), as shown in FIG. 6;
15) Anisotropically etching the silicon by using TMAH with a solution concentration of 25 wt % at 40° C., so that the upper and lower ultra narrow silicon wires are completely separated, as shown in FIG. 7;
16) Removing the $Si_3N_4$ wet-etch masking layer by using heated (170° C.) concentrated phosphoric acid;
17) Performing dry oxidation at 925° C. to obtain silicon nanowires each having a circular cross section and a diameter of 5 nm;
18) Removing the oxidation layer wrapping each silicon nanowire by using BHF solution (HF:$NH_4F$=1:40), as shown in FIG. 8;

As a result, two layers of nanowires each having a diameter of about 5 nm are obtained.

Embodiment 2

Three layers of nanowires each having a diameter of about 10 nm is fabricated.

The fabrication is as same as the embodiment 1 expect for the following steps:

a) Selecting and using an (110) SOI substrate;
b) For performing the steps 1) to 4), depositing polycrystalline germanium of 500 Å as a sacrificial layer by ICPECVD and depositing $SiO_2$ of 200 Å as a wet-etch masking layer by ICPECVD;
c) After performing the step 4), performing the following two steps: 4.1) depositing polycrystalline germanium of 500 Å as the sacrificial layer by ICPECVD; 4.2) depositing $SiO_2$ of 200 Å as the wet-etch masking layer by ICPECVD:
d) For the step 5), defining an epitaxy window for Fins and source/drain regions by 193 nm immersion photolithography, wherein the Fin has a width of 30 nm and a length of 300 nm, meanwhile, the axial direction of the Fin extends along a crystal orientation of <110>, and the crystal orientation of the Fin sidewalls extends along <100>:
e) For the step 8), growing Si of 2500 Å by selective epitaxy;
f) For the step 10), depositing $SiO_2$ of 500 Å by ICPECVD as a top masking layer;
g) In the step 11), defining a wet-etch window for silicon by 193 nm immersion photolithography;
h) In the step 14), removing the polycrystalline germanium sacrificial layer at room temperature by using a mixed solution of ammonium hydroxide and hydrogen peroxide ($NH_4OH$: $H_2O_2$: $H_2O$=2:2:5);
i) In the step 16), removing the $SiO_2$ wet-etch masking layer by using BHF solution (HF:$NH_4F$=1:40).

As a result, three layers of nanowires each having a diameter of about 10 nm is obtained.

The present invention is not limited by the embodiments of the present invention. Without departing from the scope of the technical solution of the present invention, a number of variations and modifications may be made possible to the technical solution of the present invention using the method and technical contents disclosed above, or equivalent embodiments may be modified. Therefore, any simple modifications, equivalent changes and modifications made to the above embodiments according to the technical spirit of the present invention without departing from the contents of the technical solution of the present invention all fall into the protection scope of the technical solution of present invention.

What is claimed is:

1. A method for fabricating multiple layers of ultra narrow silicon wires, wherein the method comprises the following steps:
   A. fabricating wet-etch masking layers for silicon, wherein multiple layers of wet-etch masking layers are formed at sidewalls of a fin-shaped silicon island Fin that is to be formed by step B3, wherein the step comprises:
      A1. depositing a sacrificial layer on a silicon substrate;
      A2. depositing a wet-etch masking layer on the sacrificial layer;
      A3. repeating the steps A1 and A2 alternately to form a periodic stack structure of the sacrifice layer—the masking layer;

B. forming the Fin and source/drain regions located at both ends thereof by an epitaxy process, wherein the epitaxy process is performed on the silicon substrate to form the Fin and source/drain regions connected to both ends thereof, and wherein the step comprises:
  B1. defining an epitaxy window for the Fin and the source/drain regions by photolithography on the periodic stack structure of the sacrificial layer—the masking layer formed in the step A3;
  B2. performing an anisotropic etching process to transfer patterns defined by the photolithography onto the stack structure of the sacrificial layer—the masking layer and to expose the silicon substrate;
  B3. forming the Fin and the source/drain regions connected to both ends of the Fin within the etched epitaxy window formed in the step B2 by an epitaxy process, wherein the epitaxial silicon has a greater thickness than the total thickness of the stack structure of the sacrificial layer—the masking layer;
  B4. removing the silicon on top of the wet-etch masking layer by chemical mechanical polishing to expose the wet-etch masking layer;
  B5. depositing a wet-etch masking layer on top of the Fin and the source/drain regions connected to both ends of the Fin, which are formed by the epitaxy process;
  B6. defining a wet-etch window for the silicon by photolithography on the periodic stack structure of the sacrificial layer—the masking layer;
  B7. performing an anisotropic etching process to transfer patterns defined by photolithography onto the stack structure of the sacrificial layer—the masking layer and to expose the silicon substrate;
  B8. removing the sacrificial layer by wet-etch;
C. forming the multiple layers of ultra narrow silicon wires, wherein anisotropic wet etch is performed from the sidewalls of the Fin, so that the wet-etch self-stops at (111) crystal plane under protection of the wet-etch masking layer at the sidewalls, and multiple layers of ultra narrow silicon wires each having a polygonal cross section are formed, and then the area of the cross section is further reduced by sacrificial oxidation to form a circular cross section, and wherein the step comprises:
  C1. forming multiple layers of ultra narrow silicon wires each having a polygonal cross section by anisotropic wet etch;
  C2. removing the masking layer by wet etch;
  C3. forming multiple layers of ultra narrow silicon wires each having a circular cross section by sacrificial oxidation;
  C4. removing the sacrificial oxidation layer wrapping the ultra narrow silicon wire by isotropic wet etch.

2. The method for fabricating multiple layers of ultra narrow silicon wires according to claim 1, wherein in the step A, the number and positions of the wet-etch masking layers determine the number and positions of the ultra narrow silicon wires, and the thickness of the sacrificial layer defines the interval between the ultra narrow silicon wires, and wherein in order to ensure that the multiple layers of ultra narrow silicon wires formed by the step C1 are completely separated up and down, the thickness H of the sacrificial layer and the width $W_{Fin}$ of the Fin should satisfy the following conditions: $H > W_{Fin} * \tan 54.7°$ for a (100) substrate, $H > W_{Fin} * \cot 54.7°$ for a (110) substrate, and $H > 0$ for a (111) substrate, where 54.7° is an intersection angle between crystal planes of (100) and (111) of silicon.

3. The method for fabricating multiple layers of ultra narrow silicon wires according to claim 1, wherein in the step B, in order to ensure that the anisotropic wet-etch to the sidewalls of the Fin that is performed in the step C1 self-stops at (111) crystal plane to form the multiple layers of suspended ultra narrow silicon wires each having a polygonal cross section, the crystal orientation of the substrate, the axial direction of the Fin and the crystal orientation of the sidewalls should satisfy that the following conditions: the axial direction of the Fin and the crystal orientation of the Fin sidewalls both extend along <110> for a (100) substrate, the axial direction of the Fin extends along <110> and the crystal orientation of the Fin sidewalls extends along <100>, for a (110) substrate; the axial direction of the Fin extends along <112> and the crystal orientation of the Fin sidewalls extends along <110> for a (111) substrate,
  and wherein the source-drain region is selected to have a micron scale so that both ends of the ultra narrow silicon wires formed by the step C1 have enough silicon as a support,
  and wherein the aspect ratio of a Fin is selected to satisfy the numbers of layers of the resultantly formed ultra narrow silicon wires.

4. The method for fabricating multiple layers of ultra narrow silicon wires according to claim 1, wherein in the steps A1 and B2, the substrate is a bulk silicon substrate or a SOI substrate.

5. The method for fabricating multiple layers of ultra narrow silicon wires according to claim 1, wherein in the steps B1 and B6, the photolithography is electron beam photolithography or 193 nm immersion photolithography.

6. The method for fabricating multiple layers of ultra narrow silicon wires according to claim 1, wherein in the steps A1, A2, A3 and B5, the deposition is atomic layer deposition (ALD), low pressure chemical vapor deposition (LPCVD), plasma enhanced chemical vapor deposition (PECVD), inductively coupled plasma enhanced chemical vapor deposition (ICPECVD) or sputtering.

7. The method for fabricating multiple layers of ultra narrow silicon wires according to claim 1, wherein the sacrificial layer is formed of $SiO_2$, and the $SiO_2$ sacrificial layer is removed by BHF solution with a solution concentration of $HF:NH_4F=1:30-1:100$ at room temperature, and wherein the wet-etch masking layer is formed of $Si_3N_4$, and the $Si_3N_4$ masking layer is removed using concentrated phosphoric acid at 170° C.

8. The method for fabricating multiple layers of ultra narrow silicon wires according to claim 1, wherein the combination of the sacrificial layer and the masking layer satisfies the following conditions: the ratio of etch rates of the sacrificial layer and the wet-etch masking layer is 1:0.5-1:2; the ratio of etch rates of the sacrificial layer and the photoresist is greater than 5:1; the ratio of etch rates of the wet-etch masking layer and the photoresist is greater than 5:1; the ratio of etch rates of the sacrificial layer and the silicon is greater than 5:1; the ratio of etch rates of the wet-etch masking layer and the silicon is greater than 5:1.

9. The method for fabricating multiple layers of ultra narrow silicon wires according to claim 1, wherein the anisotropic wet-etch of the silicon is performed by using tetramethyl ammonium hydroxide (TMAH) solution with a solution concentration of 10 wt %-25 wt % at 35° C.-60° C.

10. The method for fabricating multiple layers of ultra narrow silicon wires according to claim 1, wherein in the step C3, the sacrificial oxidation of the ultra narrow silicon wires is dry oxidation at an oxidation temperature of 850° C.-950° C.

* * * * *